United States Patent
Tsukiyama et al.

(10) Patent No.: US 9,773,697 B2
(45) Date of Patent: Sep. 26, 2017

(54) METHOD OF MANUFACTURING SEMICONDUCTOR DEVICE

(71) Applicant: Toshiba Memory Corporation, Tokyo (JP)

(72) Inventors: Satoshi Tsukiyama, Yokohama Kanagawa (JP); Motoshi Seto, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/054,855

(22) Filed: Feb. 26, 2016

(65) Prior Publication Data

US 2016/0351441 A1    Dec. 1, 2016

(30) Foreign Application Priority Data

May 29, 2015   (JP) .................. 2015-110739

(51) Int. Cl.
    *H01L 21/44*      (2006.01)
    *H01L 21/768*     (2006.01)
    (Continued)

(52) U.S. Cl.
    CPC .. *H01L 21/76826* (2013.01); *H01L 21/76898* (2013.01); *H01L 23/481* (2013.01);
    (Continued)

(58) Field of Classification Search
    CPC ......... H01L 21/76825; H01L 21/76804; H01L 21/76828; H01L 21/76831; H01L 21/76898
    (Continued)

(56) References Cited

U.S. PATENT DOCUMENTS 7,534,722 B2 * 5/2009 Trezza ............... H01L 21/6835
                                                257/621
2006/0148250 A1 * 7/2006 Kirby ............... H01L 21/76898
                                                438/667
(Continued)

FOREIGN PATENT DOCUMENTS

JP     2013-089816 A     5/2013
JP     2014-022396 A     2/2014
(Continued)

OTHER PUBLICATIONS

Taiwan Office Action dated Dec. 30, 2016, filed in Taiwan counterpart Application No. 104138823, 8 pages (with translation).

*Primary Examiner* — Nitin Parekh
(74) *Attorney, Agent, or Firm* — Patterson & Sheridan, LLP

(57) ABSTRACT

According to an embodiment, a method of manufacturing a semiconductor device includes forming a first opening that extends from a second surface of a semiconductor substrate opposite to a first surface toward the first surface and extending to a first insulating layer in the semiconductor substrate, performing a first annealing process in a first gas atmosphere that contains hydrogen after formation of the first opening, forming a second insulating layer on a side wall of the semiconductor substrate in the first opening, performing a second annealing process after formation of the second insulating layer, forming a second opening that extends to the conductive layer in the first insulating layer through the first opening, and forming a via that is connected to the conductive layer in the first and second openings.

12 Claims, 12 Drawing Sheets

(51) Int. Cl.
*H01L 23/48* (2006.01)
*H01L 23/532* (2006.01)

(52) U.S. Cl.
CPC .. *H01L 21/76814* (2013.01); *H01L 21/76831* (2013.01); *H01L 23/53238* (2013.01); *H01L 2224/11* (2013.01)

(58) Field of Classification Search
USPC ........................................ 438/629, 637, 667
See application file for complete search history.

(56) References Cited

U.S. PATENT DOCUMENTS

| | | | | |
|---|---|---|---|---|
| 2008/0264477 | A1* | 10/2008 | Moslehi | H01L 31/022425 136/255 |
| 2010/0171226 | A1* | 7/2010 | West | H01L 23/481 257/774 |
| 2013/0115730 | A1* | 5/2013 | El-Gamal | B81C 1/00301 438/51 |
| 2014/0021633 | A1* | 1/2014 | Lee | H01L 23/481 257/774 |
| 2016/0118391 | A1* | 4/2016 | Zhao | H01L 21/3003 257/66 |

FOREIGN PATENT DOCUMENTS

| | | |
|---|---|---|
| JP | 2014041879 A | 3/2014 |
| TW | I312577 B | 7/2009 |

* cited by examiner

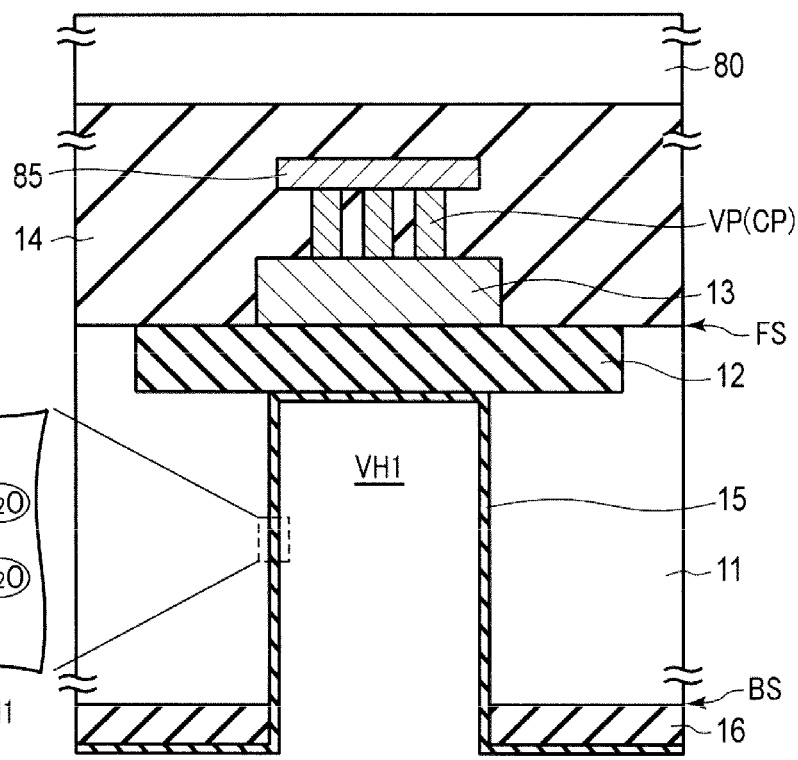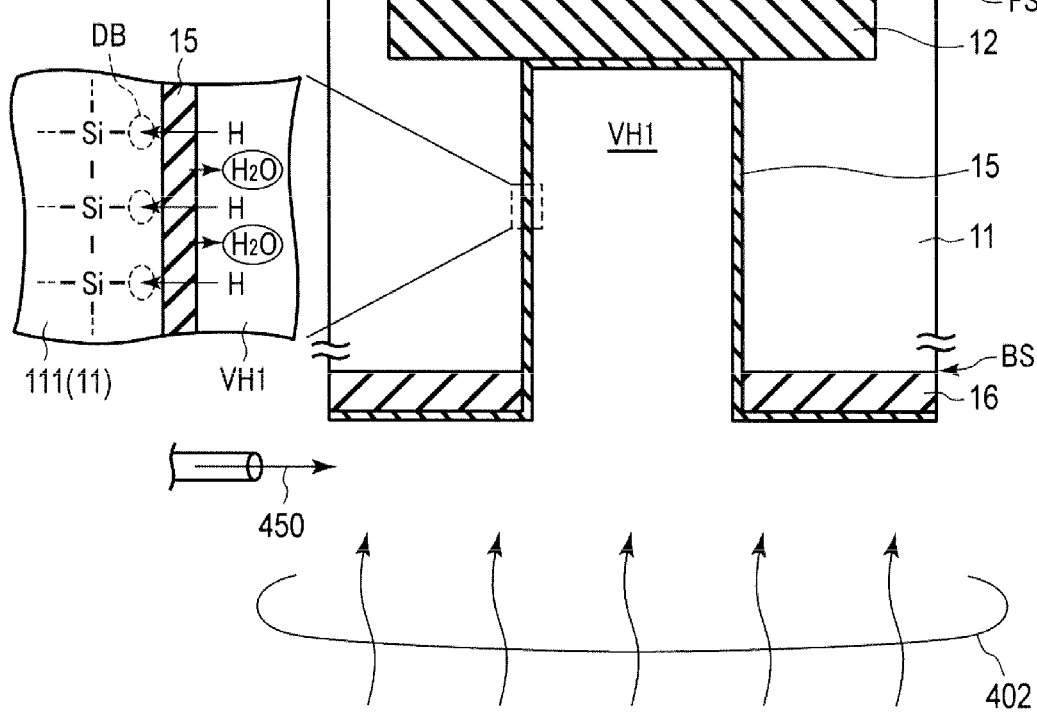

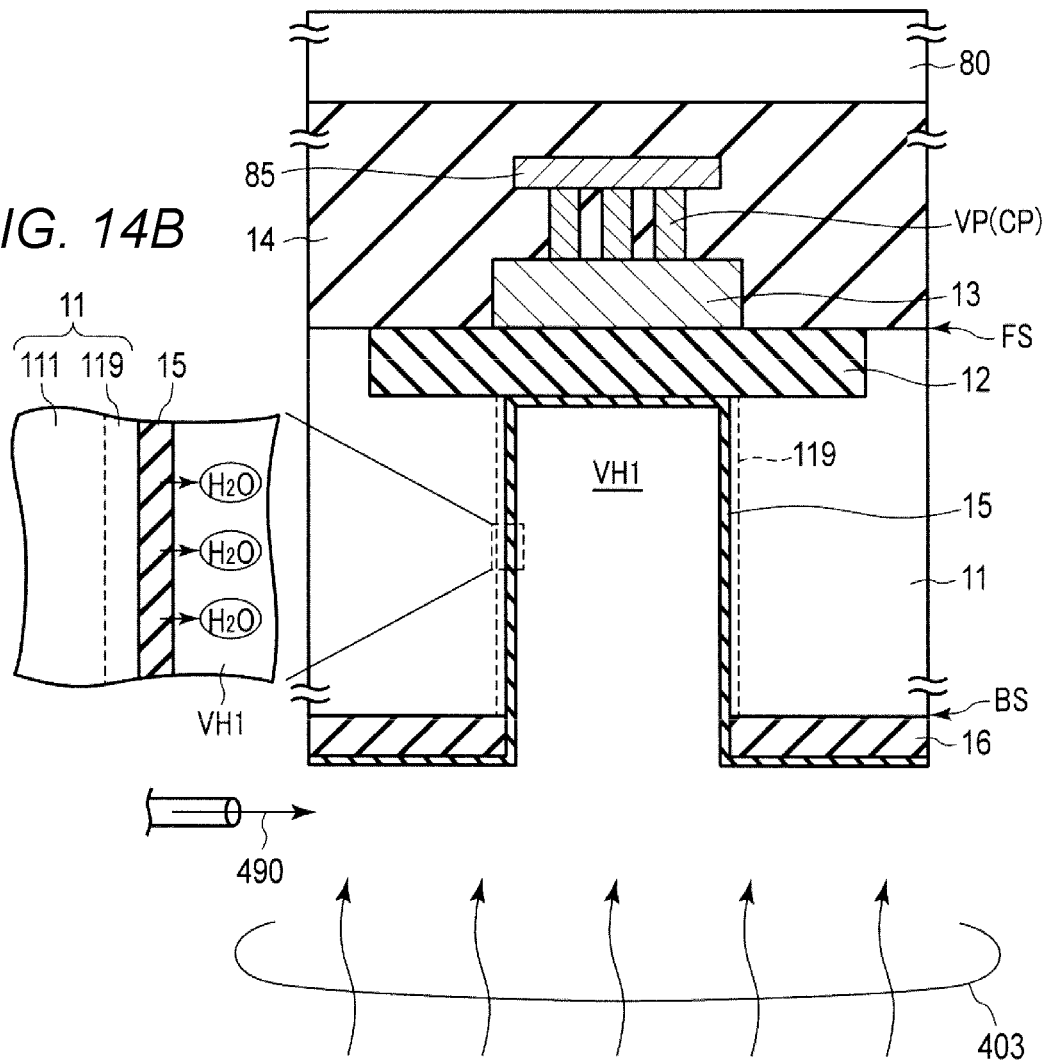

METHOD OF MANUFACTURING SEMICONDUCTOR DEVICE

CROSS-REFERENCE TO RELATED APPLICATION

This application is based upon and claims the benefit of priority from Japanese Patent Application No. 2015-110739, filed May 29, 2015, the entire contents of which are incorporated herein by reference.

FIELD

Embodiments described herein relate generally to a method of manufacturing a semiconductor device.

BACKGROUND

Recently, high density package substrates are provided with a through silicon via (TSV) to mount a semiconductor device (semiconductor chip) on the package substrate.

DESCRIPTION OF THE DRAWINGS

FIG. 13A is a cross-sectional process view illustrating a process of a method of manufacturing a semiconductor device according to a second embodiment.

FIG. 13B is an enlarged view of a portion of the semiconductor device of FIG. 13A.

FIG. 14A is a cross-sectional process view illustrating a process of a method of manufacturing a semiconductor device according to a third embodiment.

FIG. 14B is an enlarged view of a portion of the semiconductor device of FIG. 14A.

DETAILED DESCRIPTION

Figure 1:
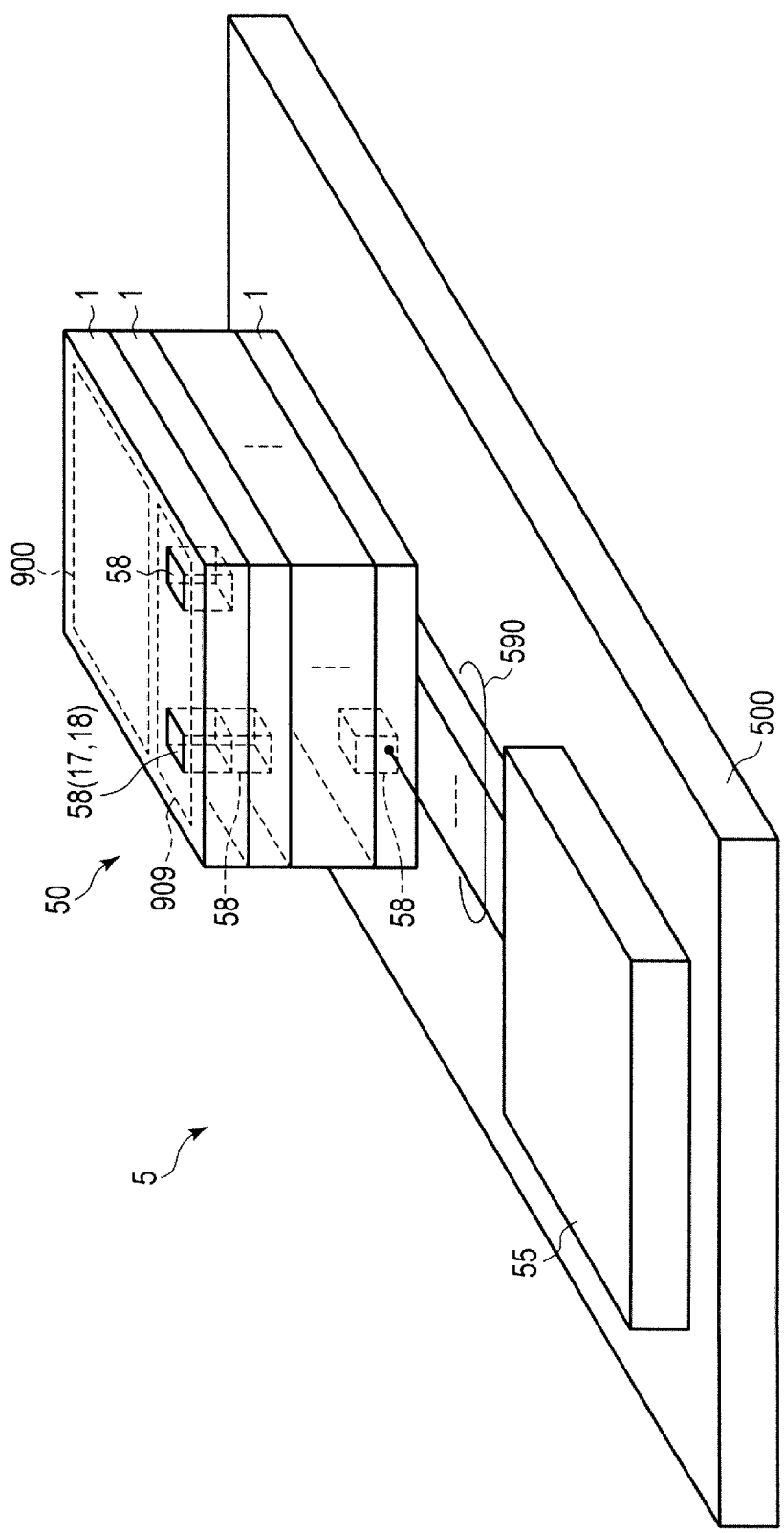
FIG. 1 is a schematic view illustrating a semiconductor device according to an embodiment.

An object of exemplary embodiments is to provide a semiconductor device with high reliability.

In general, according to an embodiment, a method of manufacturing a semiconductor device, includes: forming a first insulating layer on a first surface side of a semiconductor substrate that contains silicon; forming a conductive layer on the first insulating layer; forming a first opening, that extends from a second surface of the semiconductor substrate opposite to the first surface toward the first surface, and reaches the first insulating layer, in the semiconductor substrate; carrying out a first annealing process in a first gas atmosphere that contains hydrogen after formation of the first opening; forming a second insulating layer on a side wall of the semiconductor substrate in the first opening; carrying out a second annealing process after formation of the second insulating layer; forming a second opening that reaches the conductive layer in the first insulating layer through the first opening; and forming a first via that is connected to the conductive layer in the first and second openings.

Hereinafter, embodiments will be described in detail with reference to the accompanying drawings. In the following description, the same reference numeral will be given to elements having the same function and configuration, and a detailed description of the element(s) will not be repeated for brevity.

Embodiments

Semiconductor devices and methods of manufacturing the semiconductor devices according to embodiments will be described with reference to FIGS. 1 to 13.

(1) First Embodiment

A semiconductor device and a method of manufacturing the semiconductor device according to a first embodiment will be described with reference to FIGS. 1 to 11.

(a) Configuration Example

FIG. 1 is a schematic view illustrating the semiconductor device according to the first embodiment.

As illustrated in FIG. 1, a storage device (memory system) 5 includes a semiconductor memory 50 and a memory controller 55.

The storage device 5 is coupled to a host device (not illustrated) on an outer side or edge of the storage device 5 through an interface (host interface).

In response to a request of the host device, data is transmitted between the semiconductor memory 50 and the memory controller 55. An operation of the semiconductor memory 50 is controlled by the memory controller 55. The memory controller 55 outputs a command and a control signal, which controls the operation of the semiconductor memory 50, to the semiconductor memory 50 based on a request from the host device. The semiconductor memory 50 then responds the memory controller 55.

In the storage device 5, the semiconductor memory 50 and the memory controller 55 are provided on a package substrate 500.

The semiconductor memory (hereinafter, also referred to as a memory package or a package device) 50 includes a plurality of semiconductor devices (semiconductor chips) 1 in one package.

Each of the semiconductor devices 1 includes a circuit area 900 and an external connection terminal area 909. In FIG. 1, the external connection terminal area 909 is provided between the circuit area 900 and an end of a chip. However, the external connection terminal area 909 may be provided between two circuit areas 900.

A semiconductor integrated circuit (memory circuit) is provided in the circuit area 900.

A plurality of external connection terminals 58 are provided in the external connection terminal area 909. Examples of the external connection terminals 58 include a terminal for input and output of data, a terminal for input and output of various control signals, and the like.

In the semiconductor memory 50, the plurality of semiconductor devices 1 are stacked in a direction perpendicular to a major surface of the package substrate 500. In a stacked body of the semiconductor devices 1, the plurality of semiconductor devices 1 are provided on the package substrate 500 in such a manner that the external connection terminal area 909 of the uppermost semiconductor device (semiconductor chip) 1 overlaps or aligns with the external connection terminal areas 909 of the semiconductor devices 1 below.

For example, each of the external connection terminals 58 includes a bump 18 that is provided on a front surface and a back surface of the semiconductor chip 1 and a through-via 17. The bump (or pad) 18 is connected to a semiconductor integrated circuit through an interconnection in the semiconductor chip 1 and the through-via 17. The interconnection is a through silicon via (TSV) type.

However, FIG. 1 illustrates an example in which the external connection terminal 58 is provided along one side of the semiconductor chip 1 for simplification of explanation. In other examples, the external connection terminal 58 may be provided along other sides of the semiconductor chip 1.

The external connection terminal 58 of the semiconductor device 1 is connected to an external connection terminal of the memory controller 55 through an interconnection 590 on the package substrate 500 (inside the package substrate 500). Accordingly, the semiconductor memory 50 (semiconductor device 1) and the memory controller 55 carry out transmission and reception of data and various control signals.

Figure 2:
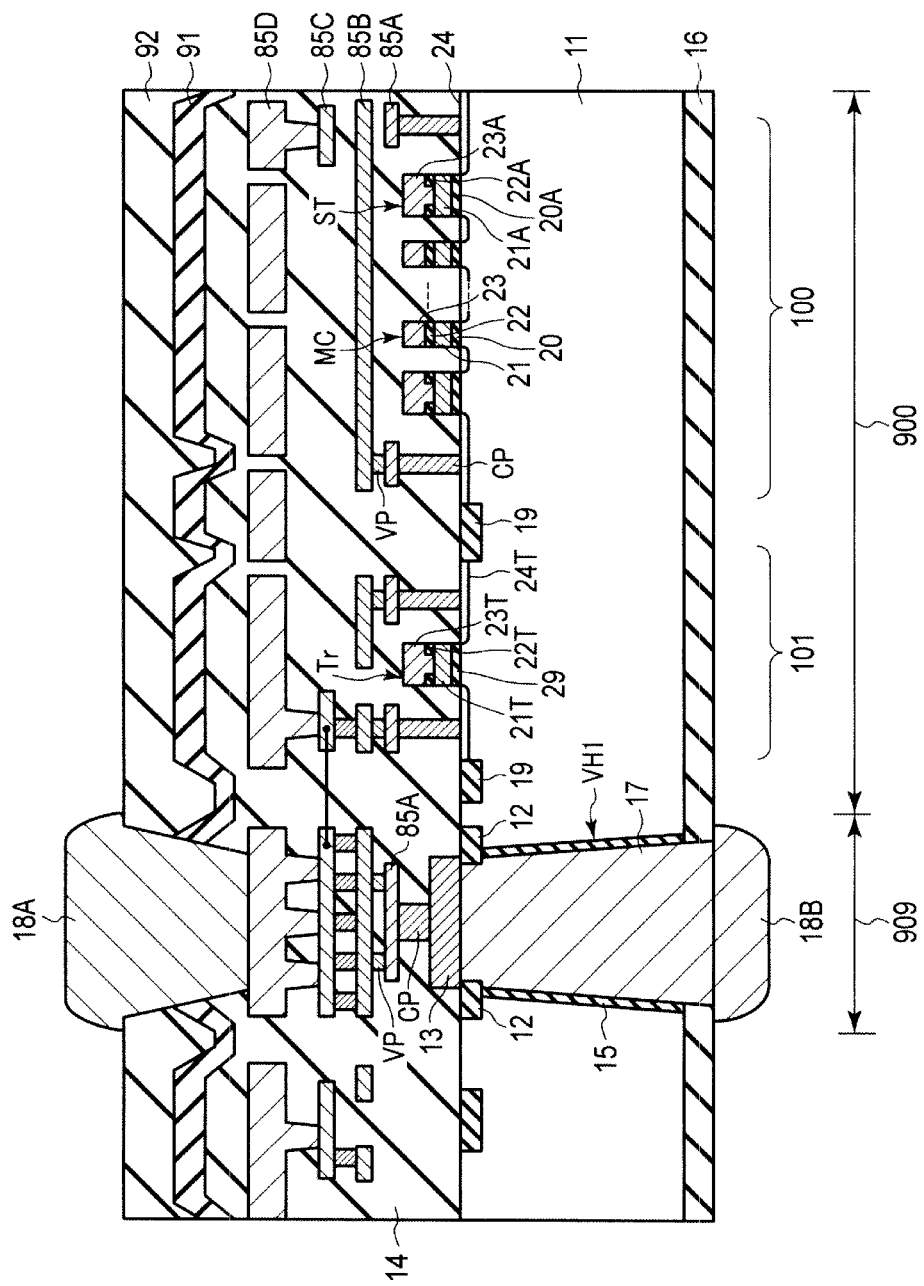
FIG. 2 is a schematic view illustrating the semiconductor device according to the embodiment.

FIG. 2 is a cross-sectional view schematically illustrating a structural example of the semiconductor device according to an embodiment. The semiconductor device of this embodiment may be the semiconductor devices (semiconductor chip) 1 of FIG. 1.

A semiconductor substrate 11 is, for example, a silicon substrate. The thickness of the semiconductor substrate 11 is, for example, in a range from 30 μm to 50 μm.

Figure 4:
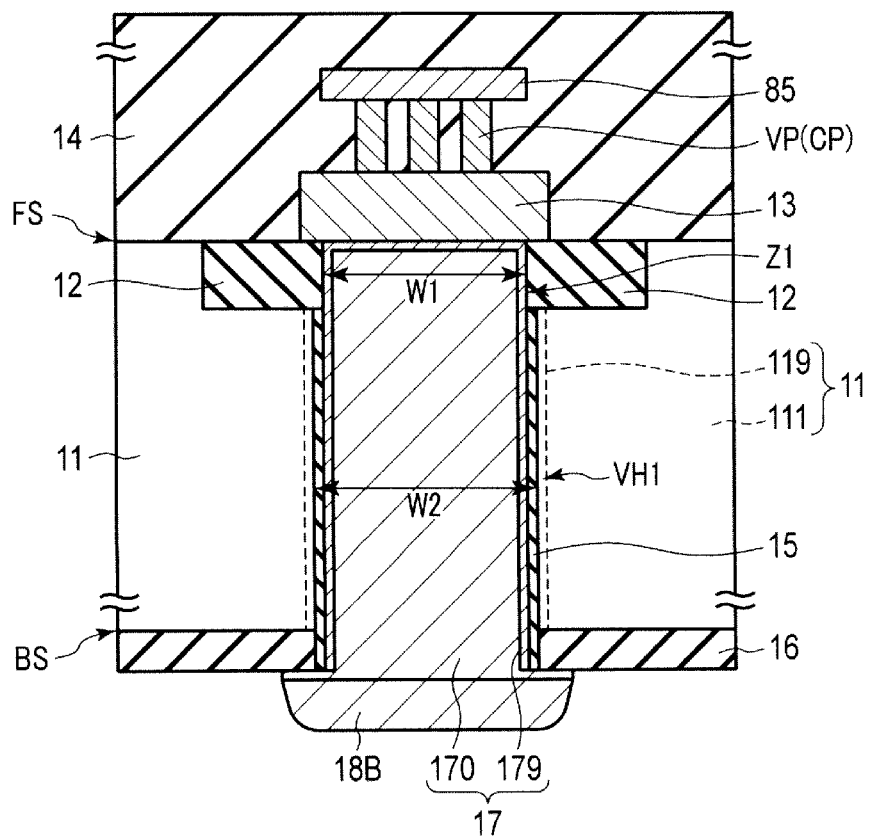
FIG. 4 is a cross-sectional view illustrating the semiconductor device according to the embodiment.

The semiconductor integrated circuit is provided in the circuit area 900 on a front surface FS side of the semiconductor substrate 11 (shown in FIG. 4). For example, the semiconductor device 1 may be a NAND type flash memory. In a case where the semiconductor device 1 is the NAND type flash memory, a memory cell array 100 and a plurality of circuits (hereinafter, referred to peripheral circuits) 101 are provided as a semiconductor integrated circuit on the semiconductor substrate 11.

In the memory cell array 100 and the peripheral circuits 101, an element is provided in an active region that is partitioned by an element isolation insulating film 19.

The memory cell array 100 includes one or more memory cells MC. Each of the memory cells MC includes a charge storage layer 21 and a control gate electrode 23. The charge storage layer 21 is provided on an upper side of the semiconductor substrate 11 adjacent to a tunnel insulating film 20 on the front surface FS of the semiconductor substrate 11. A block insulating layer 22 is provided between the charge storage layer 21 and the control gate electrode 23.

For example, the charge storage layer 21 may include at least one of a floating gate electrode (for example, a polysilicon layer) and a charge trapping film (for example, a silicon nitride film). For example, the control gate electrode 23 may have one structure selected from: a single layer structure of a metal, a single layer structure of a conductive compound, and a stacked structure of a metal and a conductive compound. Examples of a material that is used in the control gate electrode 23 include tungsten (W), nickel silicide (NiSi), and the like. The control gate electrode 23 may include a doped polysilicon layer between a silicide (or a metal) and the block insulating layer 22.

The memory cell array 100 includes a select transistor ST. The select transistor ST is formed in a process similar to the memory cell MC, and has a structure similar to that of the memory cell MC. However, in the select transistor ST, a conductive layer (gate electrode layer) 23A is connected to a layer 21A on a gate insulating film 20A through an opening provided in a block insulating layer 22A.

Each of the peripheral circuits 101 controls operations of the memory cell array 100. The peripheral circuits 101 include a plurality of field effect transistors Tr. Each of the field effect transistors Tr has a structure similar to that of the select transistor ST.

The transistor Tr includes a gate insulating film 29 on the front surface FS of the semiconductor substrate 11, a first layer 21T on the gate insulating film 29, a second layer 23T on an upper side of the first layer 21T, and a source/drain region 24T. For example, an insulating layer 22T having an opening may be provided between the first layer 21T and the second layer 23T.

For example, the transistor Tr is formed in a process that is similar to formation of the memory cell MC and the select transistor ST. However, the transistor Tr may be formed in a process different from a process of forming the elements MC and ST in the memory cell array 100. For example, the gate insulating film 29 may be formed in a process that differs from a process of forming the gate insulating film of the select transistor ST.

In the circuit area 900 and the external connection terminal area 909, an interlayer insulating film 14 and an interconnection 85 (85A, 85B, 85C, and 85D), which have a multi-layer interconnection structure, are provided on the front surface FS of the semiconductor substrate 11. A first passivation layer (for example, silicon nitride layer) 91 and a second passivation layer (for example, a polyimide layer) 92 are provided on the interlayer insulating film 14.

The interlayer insulating film 14 has a stacked structure of a plurality of insulating films (for example, a silicon nitride film and a silicon oxide film). Each of the interconnections 85 is provided in each layer (interconnection levels) of the interlayer insulating film 14. A plurality of the interconnections 85 at different interconnection levels are connected to each other through a via-plug VP. For example, the interconnection 85 is a metal layer containing aluminum (Al), tungsten (W), or copper (Cu). The elements MC, ST, and Tr on the semiconductor substrate 11 are connected to the interconnection 85A through a contact plug CP.

Accordingly, a plurality of elements (circuits) on the semiconductor substrate 11 are connected to each other, and thus a semiconductor integrated circuit (here, an NAND type flash memory) having a desired function is formed. As described above, the semiconductor integrated circuit in the circuit area 900 includes a plurality of elements MC, ST, and Tr, and various interconnections 85, CP, and VP.

In the external connection terminal area 909 of the semiconductor substrate 11, the bumps 18 (18A and 18B) are provided on a front surface FS side of the semiconductor substrate 11, and on aback surface BS side of the semiconductor substrate 11, respectively (both shown in FIG. 4), as the external connection terminal.

In this embodiment, the front surface FS of the semiconductor substrate 11 is a surface (element forming surface) on which an element such as the memory cell MC is provided. The back surface BS of the semiconductor substrate 11 is a surface that is opposite to the front surface FS of the semiconductor substrate 11. In a direction perpendicular to the front surface FS of the semiconductor substrate 11, the back surface BS of the semiconductor substrate 11 faces away from the front surface FS of the semiconductor substrate 11. However, in a case where the front surface and the back surface of the semiconductor substrate 11 are indistinguishable, the front surface (or back surface) of the semiconductor substrate 11 is called a principal surface of the semiconductor substrate 11.

On a front surface FS side of the semiconductor substrate 11, a front surface bump (front surface electrode) 18A is provided extending through and on the passivation layer 92. The front surface bump 18A is connected to an element in the circuit area 900 through the interconnection 85 and the plug VP and CP.

For example, the front surface bump 18A may have a single-layer structure using a material selected from nickel (Ni), copper (Cu), gold (Au), tin (Sn), and a tin alloy. Alternatively, the front surface bump may have a stacked structure using a plurality of materials selected from Ni, Cu, Au, Sn, and a Sn alloy.

On a back surface BS side of the semiconductor substrate 11, an external connection terminal of a TSV type is provided, As shown in FIGS. 2 and 4, the through-via (TSV) 17 is provided in the semiconductor substrate 11. The through-via 17 is embedded in a via-hole VH1 in the semiconductor substrate 11. The through-via 17 extends from the back surface BS of the semiconductor substrate 11 toward the front surface FS of the semiconductor substrate 11. The through-via 17 reaches a member (conductive layer 13, the interconnection 85, or the contact plug CP) on a front surface FS side of the semiconductor substrate 11. An insulating layer 15 is provided between the semiconductor substrate 11 and the through-via 17.

The back surface bump (back surface electrode) 18B is provided on the back surface BS side of the semiconductor substrate 11. The back surface bump 18B is provided on the through-via 17 in the semiconductor substrate 11. The back surface bump 18B is connected to members (the conductive layer 13, the interconnection 85, the contact plug CP, and the front surface via 18A) on a front surface side of the semiconductor substrate 11 through the through-via 17.

In addition, the back surface bump 18B is connected to an external connection terminal (for example, the front surface bump 18A) of another semiconductor chip.

For example, as with the front surface bump 18A, the back surface bump 18B may have a single-layer structure using a material selected from Ni, Cu, Au, Sn, and a tin alloy, or a stacked structure using a plurality of materials selected from Ni, Cu, Au, Sn, and a Sn alloy.

A third passivation layer (insulating layer) 16 is provided on the back surface BS of the semiconductor substrate 11. The passivation layer 16 insulates the back surface bump 18B and the semiconductor substrate 11 from each other. For example, the passivation layer 16 may be a silicon oxide film, a silicon nitride film, or a stacked film of silicon oxide film and silicon nitride film.

For example, a ring-shaped insulating layer 12 is provided in the external connection terminal area 909 on a front surface FS side of the semiconductor substrate 11. The insulating layer 12 functions as an etch stop during formation of the via-holes VH1 in the semiconductor substrate 11 in a back side via (BSV) process.

Figure 3:
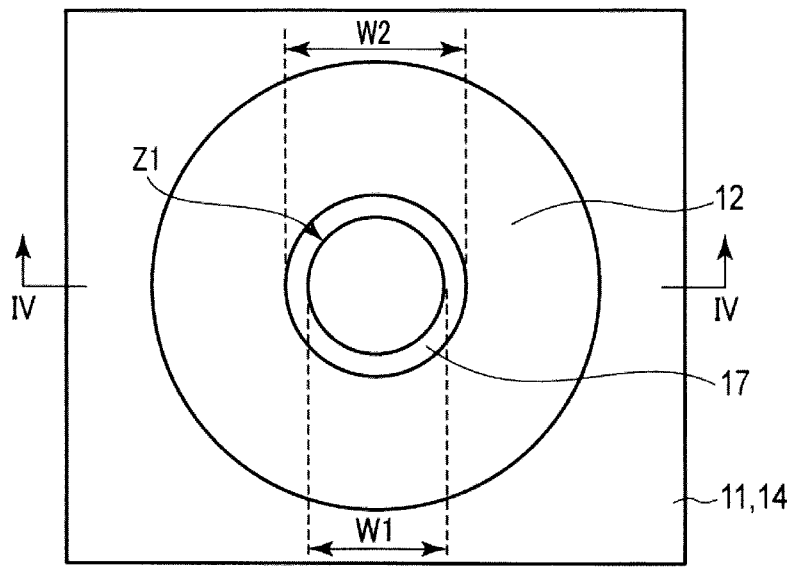
FIG. 3 is a plan view illustrating the semiconductor device according to the embodiment.

A structural example of the through-via (through-electrode) of the semiconductor device in FIG. 1 will be described in more detail with reference to FIGS. 3 and 4. FIGS. 3 and 4 illustrate an example of a structure of the through-via of the semiconductor device according to this embodiment. FIG. 4 is a cross-sectional view taken along line IV-IV in FIG. 3.

On a front surface FS side of the semiconductor substrate 11, the insulating layer 12 has a first opening Z1 and the conductive layer 13 overlying the first opening Z1 and a portion of the insulating layer 12.

As illustrated in FIG. 3, for example, the insulating layer 12 and the first opening Z1 may have a circular shape when viewed from a direction that is perpendicular to the principal surface (front surface FS/back surface BS) of the semiconductor substrate 11. The insulating layer 12 may be a circular ring-shaped structure. The shape of the insulating layer 12 and the first opening Z1 may be a polygonal shape (for example, a rectangular shape and an octagonal shape) or an elliptical shape when viewed in plan view.

For example, the insulating layer 12 may be a silicon oxide layer. The thickness of the insulating layer 12 may be approximately 0.3 μm. The insulating layer 12 may contain the same material as in the element isolation insulating film 19. For example, the insulating layer 12 may be formed simultaneously with the element isolation insulating film 19.

For example, the conductive layer 13 is located on an upper side of the first opening Z1 of the insulating layer 12. The conductive layer 13 is the connection target of the through-via 17 (and the back surface bump 18B). The conductive layer 13 may be connected to the front surface bump 18A or the semiconductor integrated circuit through the interconnection 85 on a front surface FS side of the semiconductor substrate 11, the via-plug VP, and the like. The conductive layer 13 may be covered with the interlayer insulating film 14.

The conductive layer 13 has a single-layer structure including at least one of a metal layer and a conductive compound layer. For example, the conductive layer 13 includes tungsten (W) or nickel silicide (NiSi). The conductive layer 13 may have a stacked structure including the metal layer and the conductive compound layer (for example, a silicide layer). In addition, the conductive layer 13 may have a stacked structure including, for example, a doped polysilicon layer.

For example, the conductive layer 13 may be formed simultaneously with the gate electrode 23T of the transistor Tr (the control gate electrode 23 of the memory cell MC). Accordingly, a portion of the conductive layer 13 may contain the same material as in the gate electrode 23T of the transistor Tr.

The through-via 17 passes through the inside of the first opening Z1 of the insulating layer 12 and extends to the front surface FS side from the back surface BS side of the semiconductor substrate 11. The through-via 17 is connected to the conductive layer 13.

For example, the through-via 17 may have a stacked structure.

The through-via 17 of the stacked structure includes a first metal layer 170. The through-via 17 of the stacked structure includes a second metal layer 179 between the first metal layer 170 and the insulating layer 15. The second metal layer 179 is provided on the insulating layer 15 on the side wall of the via-hole VH1 (semiconductor substrate 11). Hereinafter, the second metal layer 179 will be referred to as a side wall metal layer 179. For example, the second metal layer 179 may function as a barrier metal.

In the first opening Z1 of the insulating layer 12, the side wall metal layer 179 may be provided on the side wall of the insulating layer 12. A side portion of the through-via 17 may come into contact with the side wall of the insulating layer 12. In addition, the insulating layer 15 may be provided between the through-via 17 and the side wall of the insulating layer 12.

For example, the metal layer 170 may be a metal film using at least one material selected from Ni and Cu. For example, the side wall metal layer 179 may be a single-layer film of at least one material selected from Ti, Cu, and W. However, the side wall metal layer 179 may be a stacked film of a plurality of materials selected from Ti, Cu, and W.

However, a doped polysilicon layer may be provided between the through-via 17 (for example, the metal layer 179), and the conductive layer 13.

The insulating layer 15 between the semiconductor substrate 11 and the through-via 17 electrically and physically isolates the through-via 17 from the semiconductor substrate 11. The semiconductor substrate 11 and the through-via 17 are thus insulated from one another by the insulating layer 15. For example, the insulating layer 15 may be a silicon oxide layer. Hereinafter, the insulating layer 15 is referred to as a spacer layer (or a spacer insulating layer) for clarification of explanation.

In this example, the through-via 17 has a circular shape when viewed from a direction that is perpendicular to the principal surface of the semiconductor substrate 11.

In addition, the through-via 17 has, for example, a tapered cross-sectional shape. With regard to a dimension (for example, a diameter) of the through-via 17 in a direction that is parallel with the principal surface of the semiconductor substrate 11, for example, the dimension of the through-via 17 on a back surface BS side of the semiconductor substrate 11 is greater than the dimension of the through-via 17 on a front surface FS side of the semiconductor substrate 11.

The through-via 17 has a width dimension W2 at the back surface BS of the semiconductor substrate 11. The dimension W2 is equal to or greater than a dimension W1 of the first opening Z1. For example, the width dimension of the through-via 17 in the first opening Z1 is the same as the dimension W1 of the first opening Z1.

In the semiconductor device 1 according to this embodiment, the following processes are carried out during formation of the through-via (TSV) 17 by a BSV process in a manner similar to the following method of manufacturing a semiconductor device. Specifically, an annealing process in a hydrogen atmosphere with respect to a processing surface (a side wall of the silicon substrate) of the semiconductor substrate 11 in the via-hole VH1, and an annealing process in a hydrogen atmosphere with respect to the spacer layer (insulating layer 15) are performed.

In the semiconductor device 1 according to this embodiment, a dangling bond (surface state) of silicon in the semiconductor substrate 11 is coupled to hydrogen at an interface between the semiconductor substrate 11 and the spacer layer 15 in the via-hole VH1 through the annealing process in the hydrogen atmosphere.

According to this, in the via-hole VH1, the interface (processing surface of the semiconductor substrate 11 which is formed due to formation of the via-hole) between the spacer layer 15 and the semiconductor substrate 11, is inactivated. The semiconductor device according to this embodiment may suppress trapping of holes or electrons by the dangling bond of silicon at the interface between the semiconductor substrate 11 and the spacer layer 15.

As a result, in the semiconductor device 1 according to this embodiment, it is possible to suppress a variation in capacitive component (capacitance characteristics) of the through-via 17, which is caused by the trapping (fixed charge) of the holes or the electrons.

In addition, moisture that is contained in the spacer layer 15 is removed through the annealing process with respect to the spacer layer 15. In addition, when the annealing process is carried out in the hydrogen atmosphere, a dangling bond of silicon in the spacer layer (for example, a silicon oxide layer) 15 is coupled to hydrogen.

Thus, in the semiconductor device according to this embodiment, it is possible to suppress variations in the capacitive component of the through-via which is caused by moisture contained in the spacer layer 15 and the dangling bond (and the fixed charge that is generated due to the dangling bond).

However, in the semiconductor device according to this embodiment, for example, when the annealing process in the hydrogen atmosphere is performed, a region 119 in the semiconductor substrate 11, which faces the side surface of the through-via 17 adjacent to the insulating layer 15, contains hydrogen in excess of that in the bulk single crystal semiconductor substrate 11. In this case, the semiconductor substrate 11 includes a region (hereinafter, referred to as a silicon single crystal region) 111 which does not contain hydrogen, and the region (hereinafter, referred to as a hydrogen-containing region) 119 which contains hydrogen. Region 119 exists at the surface of the opening VH1 in the semiconductor substrate 11, and slightly inwardly thereof (i.e. in a direction away from the opening VH1), to terminate dangling silicon bonds, i.e., silicon atoms in the silicon crystal which are not fully bonded to other silicon atoms and have an open bond site which can form a charge carrier trap in the bulk silicon of the semiconductor substrate 11.

As described above, the semiconductor device 1 according to this embodiment may suppress variations in capacitance of the through-via, and as a result, it is possible to achieve stabilization of the operation of the semiconductor device.

Accordingly, in the semiconductor device according to this embodiment, it is possible to provide a semiconductor device with high reliability.

(2) Manufacturing Method

A method of manufacturing a semiconductor device according to this embodiment will be described with reference to FIGS. 5 to 11. However, here, the method of manufacturing the semiconductor device according to this embodiment will be described by appropriately using FIGS. 1 to 4 in addition to FIGS. 5 to 11.

In the method of manufacturing the semiconductor device according to this embodiment, an element of the semiconductor integrated circuit and an element isolation insulating film may be sequentially formed in the circuit area 900 of the semiconductor substrate 11 and the external connection terminal area 909 on a surface side of the semiconductor substrate 11 by a typical front end process.

In a case where the semiconductor integrated circuit is a NAND type flash memory, in the circuit area 900, the memory cell MC, various kinds of transistors ST and Tr, the element isolation insulating film, and the like are formed as an element of the semiconductor integrated circuit.

For example, it is preferable that a structural member in the external connection terminal area 909 on a front surface side of the semiconductor substrate 11 is formed by a process that is substantially common to a manufacturing process with respect to the circuit area. The structural member of the external connection terminal on a front surface side of the semiconductor substrate 11 is formed as follows.

FIGS. 5 to 11 illustrate cross-sectional process views in a process of forming the through-via (TSV) in the method of manufacturing the semiconductor device (for example, a NAND type flash memory) according to this embodiment.

Figure 5:
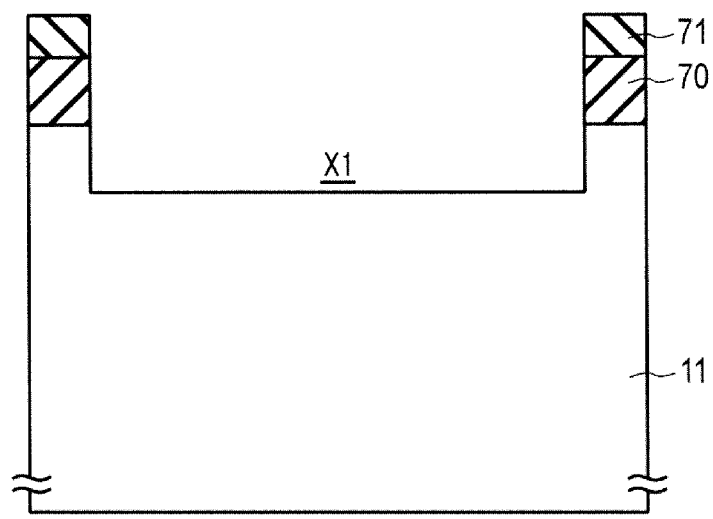
FIG. 5 is a cross-sectional process view illustrating a process of a method of manufacturing a semiconductor device according to a first embodiment.

As illustrated in FIG. 5, in the external connection terminal area 909 (shown in FIG. 2), an insulating layer (mask layer) 70 is formed on the front surface of the semiconductor substrate 11. A photo-resist layer 71 is formed on the insulating layer 70.

The photo-resist layer 71 is patterned to have an opening pattern, which may be circular, through lithography and etching or track type processes.

The insulating layer 70 is etched through and the semiconductor substrate 11 is etched inwardly thereof to from a circular recess therein by an anisotropic etching process (for example, RIE) using the photo-resist layer 71 as a mask. Thus, on a front surface FS side of the semiconductor substrate 11, recess X1 having a planar shape is formed in the semiconductor substrate 11.

However, the shape of the recess X1 (an opening pattern of the photo-resist layer 71) may be a polygonal shape (for example, an octagonal shape and a rectangular shape), an elliptical shape, a circular shape, and the like in plan view.

After the recess X1 is formed, the photo-resist layer 71 is removed.

Figure 6:
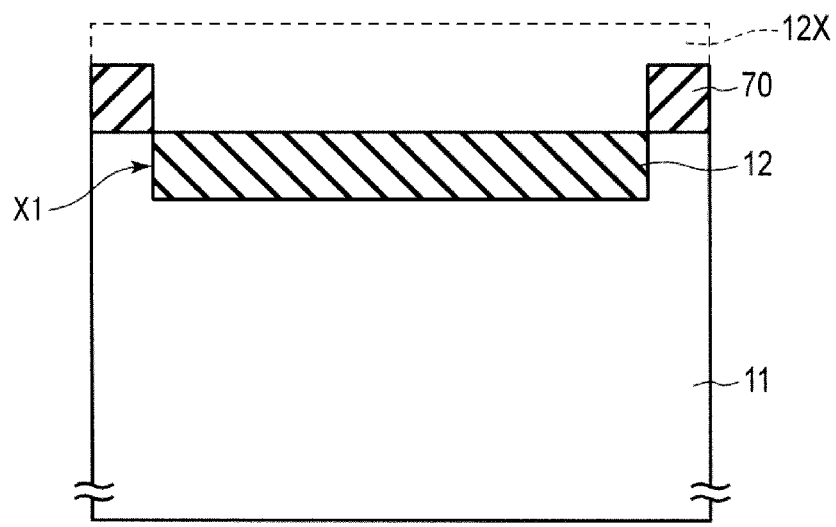
FIG. 6 is a cross-sectional process view illustrating a process of the method of manufacturing the semiconductor device according to the first embodiment.

As illustrated in FIG. 6, the insulating layer (for example, a silicon oxide layer) 12 is formed in the semiconductor substrate 11 in such a manner that the recess X1 is filled with the insulating layer 12. For example, the insulating layer 12 may be deposited on the semiconductor substrate 11 in accordance with a spin on glass (SOG) method.

An insulating layer 12X other than the insulating layer 12 in the recess is removed by chemical mechanical polishing (CMP), for example, using the insulating layer 70 as a polish stop. Thus, the insulating layer 12X is removed and an upper portion of the insulating layer 12 is planarized.

Thereafter, the upper portion of the insulating layer 12 may be etched by wet-etching. The insulating layer 12X between insulating layers 70 is removed by the etching, and a position (height) of the upper portion of the insulating layer 12 is thus located at the position (height) of the front surface FS of the semiconductor substrate 11. However, the etching step for adjustment of the position of the upper portion of the insulating layer 12 may be omitted.

As described above, the insulating layer (an etching stop in a BSV process) 12 that has a planar shape is formed in a recess of the semiconductor substrate 11.

However, the insulating layer 12, which has a shape such as a circular shape (or a polygonal shape) in plan view in the external connection terminal area 909, may be formed substantially simultaneously with, for example, the element isolation insulating film in the circuit area 900.

After the insulating layer 12 is formed, the insulating layer 70 is removed.

Figure 7:
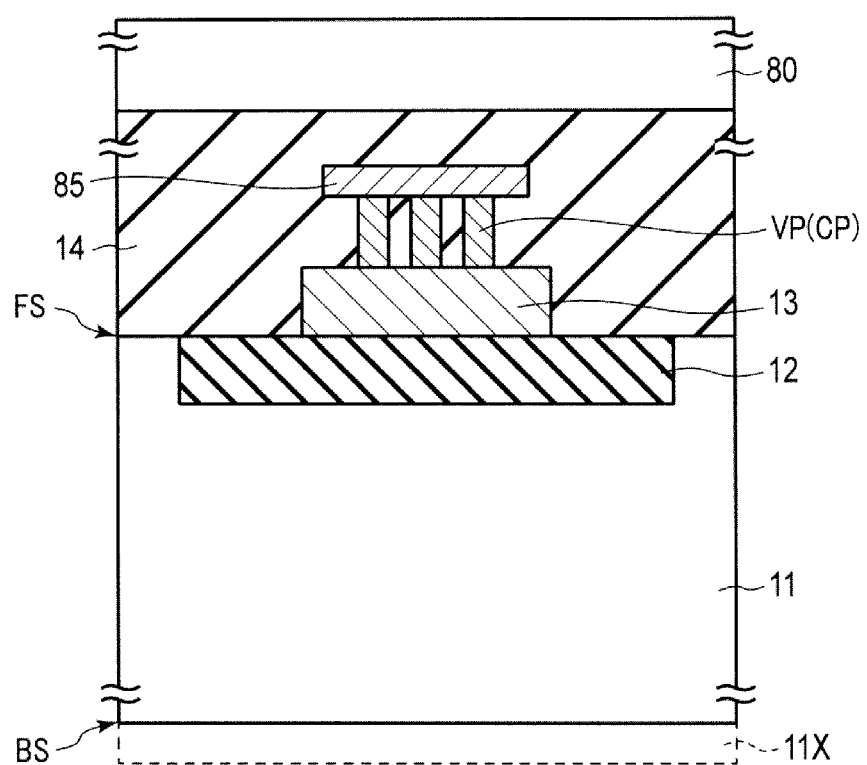
FIG. 7 is a cross-sectional process view illustrating a process of the method of manufacturing the semiconductor device according to the first embodiment.

As illustrated in FIG. 7, on a front surface FS side of the semiconductor substrate 11, the conductive layer 13 is formed on an upper side of the insulating layer 12. For example, the conductive layer 13 is formed on an upper portion of the insulating layer 12.

However, the conductive layer 13 in the external connection terminal area 901 may be formed simultaneously with the control gate electrode 23 of the memory cell MC or the gate electrode 23T of the transistor Tr (FIG. 2) in the circuit area 900 in a common process. In this case, the conductive layer 13 is formed from the same material as in the gate electrodes 23 and 23T. For example, the conductive layer 13 may have a single-layer structure of a tungsten, or a single-layer structure of a NiSi.

However, the conductive layer 13 may have a stacked structure of a silicide layer and a metal layer, or a stacked structure including a polysilicon layer in accordance with a process of forming an element in the circuit area 900 and a material of the element. In addition, in a common fabrication process for forming the circuit area 900 and the external connection terminal area 901, a layer (for example, a polysilicon layer), which contains the same material as the material of the charge storage layer 21, may be formed between conductive layer 13 and the semiconductor substrate 11.

Then, the interlayer insulating film 14, the interconnection 85, the plug (via and contact portion) VP (CP), and the passivation layer (not illustrated) are sequentially formed (refer to FIG. 1) on a front surface FS side of the semiconductor substrate 11 by a typical back end process.

Thus, the conductive layer 13 is covered with the interlayer insulating film 14, and the conductive layer 13 is connected to the plug and the interconnection. In addition, the front surface bump (not illustrated) is formed on the passivation layer to be connected to the interconnection 85.

An adhesive is applied to the interlayer insulating film 14 (more specifically, the passivation layer and the front surface bump), and a support substrate 80 is attached thereto.

Then, a portion 11X of the back surface BS of the semiconductor substrate 11 is removed by a back side grinding (BSG) process, or the like. Thus, a thickness of the semiconductor substrate 11 is reduced to approximately 30 μm to 50 μm.

Figure 8:
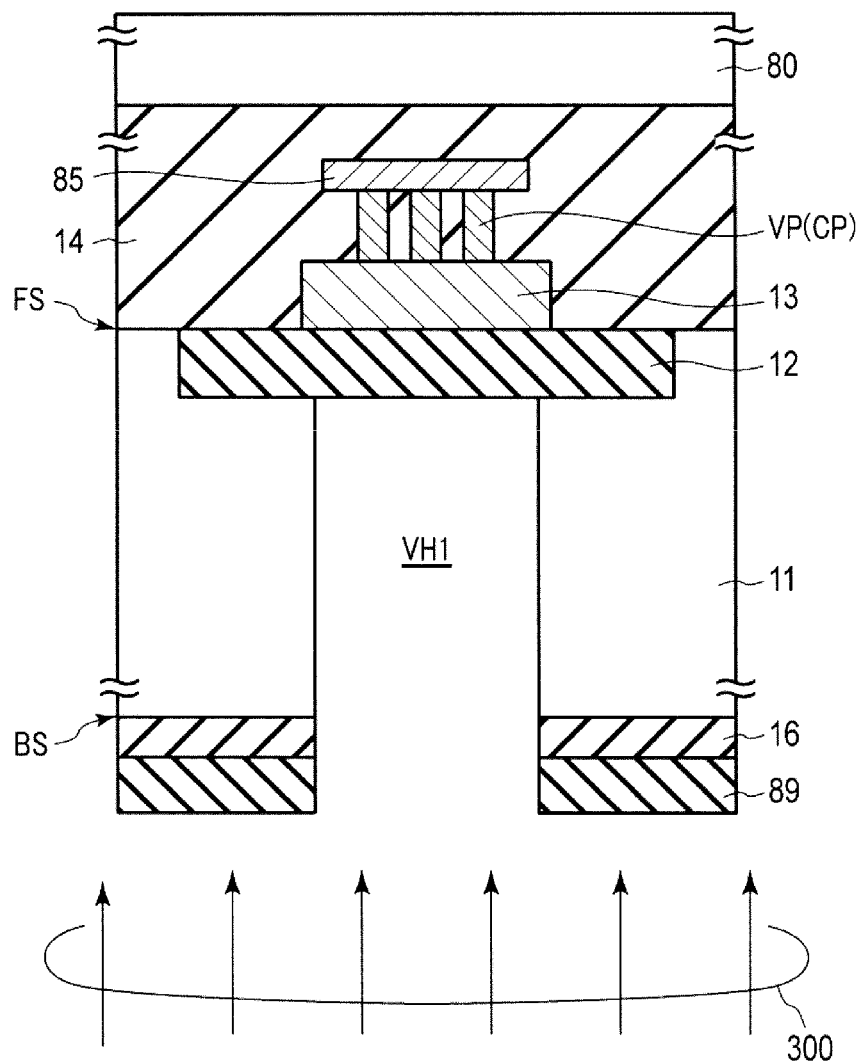
FIG. 8 is a cross-sectional process view illustrating a process of the method of manufacturing the semiconductor device according to the first embodiment.
Figure 9:
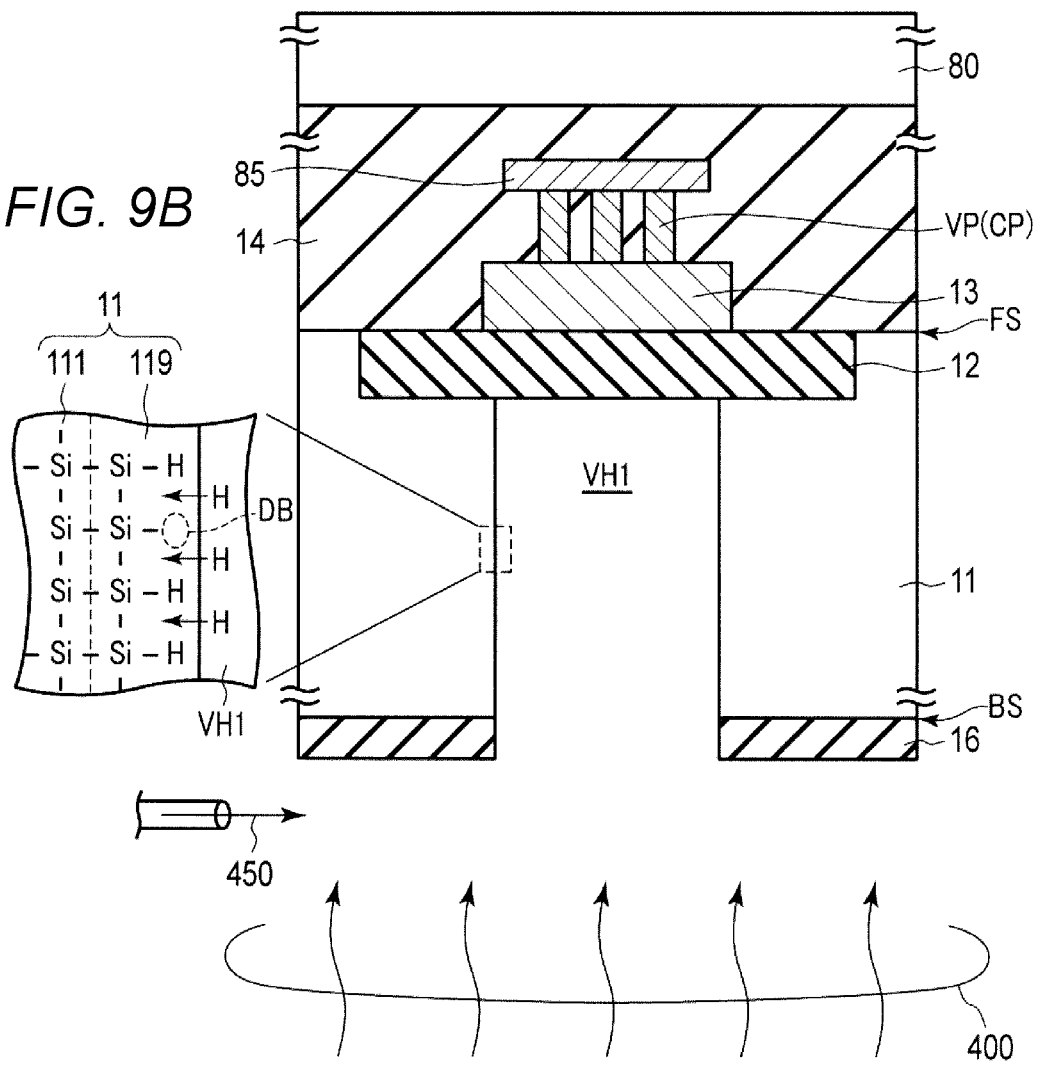
FIG. 9A is a cross-sectional process view illustrating a process of the method of manufacturing the semiconductor device according to the first embodiment.
FIG. 9B is an enlarged view of a portion of the semiconductor device of FIG. 9A.
Figure 10:
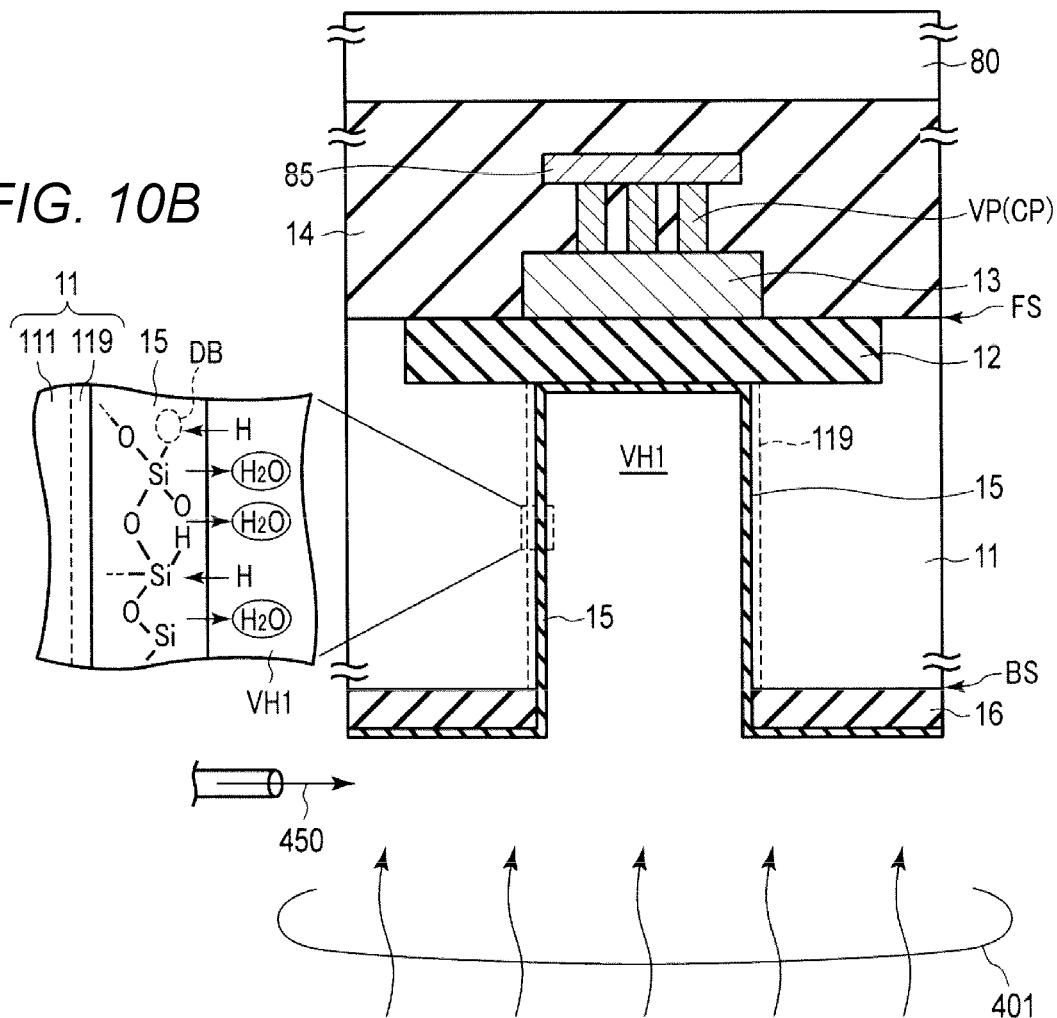
FIG. 10A is a cross-sectional process view illustrating a process of the method of manufacturing the semiconductor device according to the first embodiment.
FIG. 10B is an enlarged view of a portion of the semiconductor device of FIG. 10A.

As illustrated in FIG. 8, the passivation layer 16 is formed on the back surface BS of the semiconductor substrate 11.

A photo-resist layer 89 having a shaped opening, which may be circular, is formed on the passivation layer 16 in the external connection terminal area 909 through lithography and etching. The opening of the photo-resist layer 89 is positioned in a region in which the via-hole (through-via) is formed.

The passivation layer 16 and the semiconductor substrate (silicon substrate) 11 are selectively etched by anisotropic etching (for example, RIE) 300 using the photo-resist layer 89 as a mask.

The via-hole (second opening) VH1 is formed in the semiconductor substrate 11 by the BSV process. The via-hole VH1 extends to the insulating layer 12. Thus, the bottom of the insulating layer 12 is exposed to the via-hole VH1.

Etching to form the via-hole VH1 is performed under conditions in which etch selectivity between the semiconductor substrate 11 and the insulating layer 12 is increased. For example, an etching gas selective to etching silicon at a faster rate than the material of the insulating layer 12, such as HBr, $SF_6$, $SiF_4$, $O_2$, and the like, is used. Thus, during formation of the via-hole VH1, only the silicon of the semiconductor substrate 11 is etched, and the silicon oxide as the insulating layer 12 is barely etched.

For example, the size (dimension in a direction parallel with the principal surface of the semiconductor substrate 11) W2 of the via-hole VH1 has a value that is equal to or greater than the size (dimension in a direction parallel with the principal surface of the semiconductor substrate 11) W1 of the opening that is formed in the insulating layer 12 in the subsequent process 12.

Etch conditions for formation of the via-hole VH1 may be constant during etching, or may be changed during the course of the etch process.

As illustrated in FIG. 9A, after the via-hole VH1 is formed in the semiconductor substrate 11, an annealing process 400 in a hydrogen atmosphere is carried out.

The temperature of the annealing process 400 may be, for example, in a range from 100° C. to 250° C. A hydrogen-containing gas 450 is introduced into a chamber of an annealing apparatus through a gas supply port during the annealing process 400. For example, the gas 450 for formation of the hydrogen atmosphere may be a mixed gas including a hydrogen gas and an inert gas (for example, an argon gas).

On a side wall at which the semiconductor substrate (silicon substrate) 11 is exposed in the via-hole VH1, the dangling bond DB of silicon is coupled to hydrogen (as shown in FIG. 9B) by the annealing process 400 in the hydrogen atmosphere. Accordingly, the side wall (hereinafter, referred to as a processing surface) of the semiconductor substrate 11, which is exposed due to the forming of the via-hole VH1, is terminated with hydrogen that is coupled to silicon. Thus, the processing surface of the semiconductor substrate 11 in the via-hole VH1 is inactivated.

For example, on a surface layer of the side wall (processing surface) of the semiconductor substrate 11 in the via-hole VH1, a silicon region 119 including hydrogen may be formed due to the annealing process in the hydrogen atmosphere.

However, a hydrogen radical may be used to form the hydrogen atmosphere in the annealing process. When the hydrogen radical is used, the likelihood of coupling of the dangling bond of silicon with hydrogen is increased.

In the annealing process in the hydrogen atmosphere, a deuterium gas may be used as the hydrogen gas for formation of the hydrogen atmosphere. The mass of the deuterium ($^2H$) is heavier than the mass of lighter hydrogen ($^1H$), and is less likely to diffuse when compared to the lighter hydrogen. Accordingly, deuterium is highly likely to remain on a termination end (for example, an interface between silicon and the insulating layer) of the silicon. As a result, deuterium is recoupled to the dangling bond DB of silicon, and thus a surface state (interface state) of silicon is reduced.

When using the hydrogen radical and the deuterium gas, it is possible to reduce the dangling bond (surface state) of the processing surface of the semiconductor substrate 11 and the insulating layer 15 in the via-hole VH1.

As illustrated in FIG. 10A, the spacer layer (for example, a silicon oxide layer) 15 is formed on the side wall (processing surface) of the semiconductor substrate 11 in the via-hole VH1. For example, the spacer layer 15 is formed under relatively low temperature conditions in accordance with a plasma chemical vapor deposition (CVD) method.

An annealing process 401 is carried out with respect to the spacer layer 15 that is formed. For example, the annealing process 401 is carried out in a hydrogen atmosphere.

Moisture ($H_2O$) in the silicon oxide layer as the spacer layer 15 is removed through the annealing process 401. In addition, the dangling bond DB of silicon in the silicon oxide layer is coupled to hydrogen (shown in FIG. 10B) due to the hydrogen gas 450 that is introduced to the annealing process 401.

A temperature during the annealing process 401 with respect to the spacer layer 15 is set as, for example, an arbitrary temperature in an approximately range from 100° C. to 250° C. In addition, during the annealing process 401 with respect to the spacer layer 15, a hydrogen radical or a deuterium gas may be used to form the hydrogen atmosphere.

Figure 11:
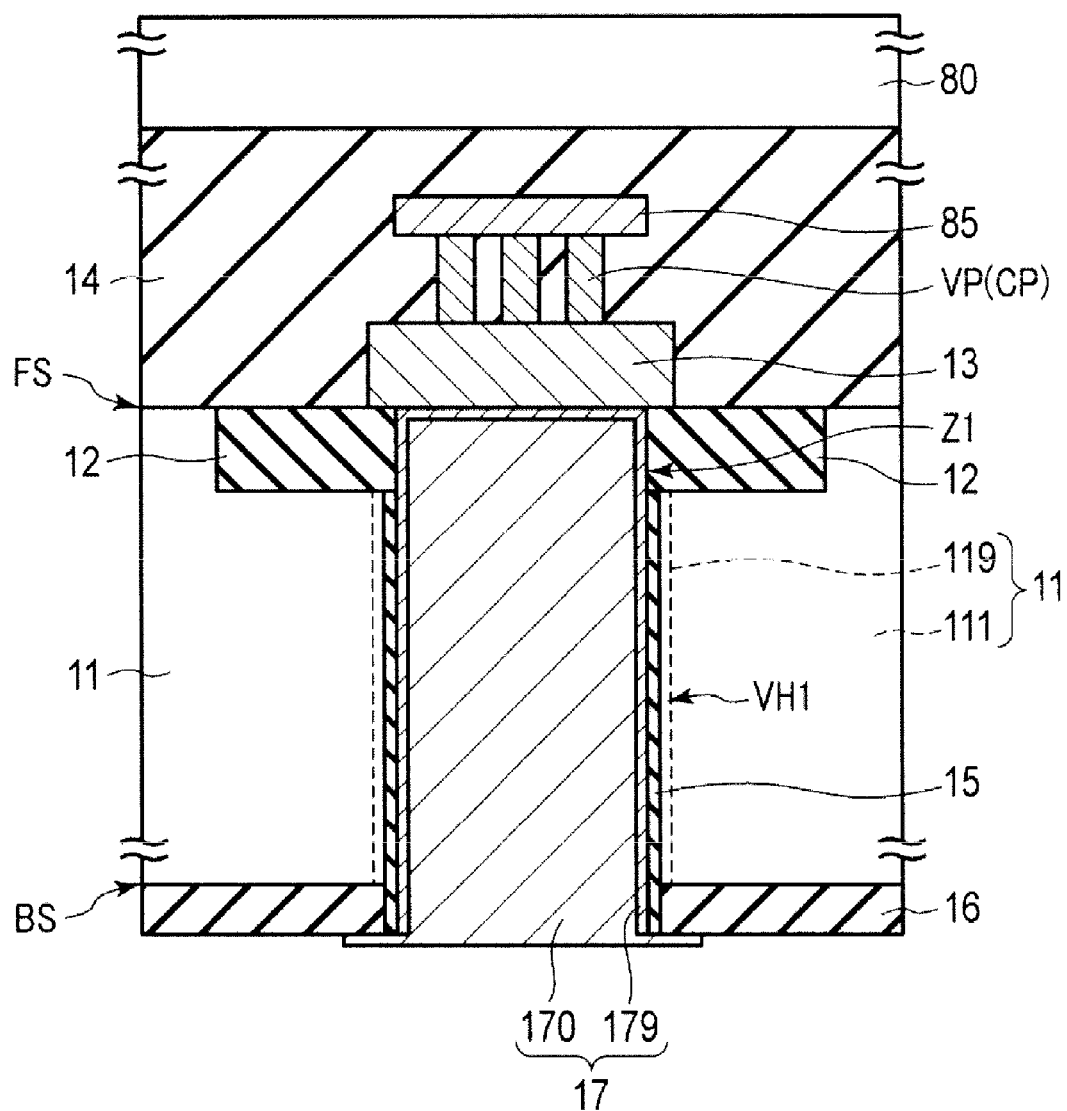
FIG. 11 is a cross-sectional process view illustrating a process of the method of manufacturing the semiconductor device according to the first embodiment.

As illustrated in FIG. 11, after the annealing process with respect to the spacer layer 15, on a bottom side (a portion opposite to the opening) of the via-hole VH1, the spacer layer 15 on the insulating layer 12, and the insulating layer 12 are removed, for example, by RIE. Thus, in the via-hole VH1, the opening Z1 is formed in the insulating layer 12, and thus the conductive layer 13 is exposed. As described above, the via-hole VH1 that extends from the back surface BS of the semiconductor substrate 11 to the front surface FS of the semiconductor substrate 11, and the opening Z1 are formed in the semiconductor substrate 11.

However, for example, the spacer layer 15 and the insulating layer 12 are configured as a silicon oxide layer. Accordingly, it is possible to etch the spacer layer 15 and the insulating layer 12 under substantially the same etching conditions. In addition, the etching of the spacer layer 15 and the etching of the insulating layer 12 may be performed in processes different from each other. In a case where the etching of the spacer layer 15 and the etching of the insulating layer 12 are performed in processes different from each other, after the via-hole VH1 is formed, the etching of the insulating layer 12 may be performed before the annealing process 400.

In addition, in a case where the conductive layer 13 includes a polysilicon layer, or in a case where the polysilicon layer is formed between the conductive layer 13 and the front surface of the semiconductor substrate 11, it is preferable that the polysilicon layer is removed after removal of the spacer layer 15 and the insulating layer 12 so as to reduce a contact resistance between the conductive layer 13 and the through-via 17.

Then, a conductor (for example, a metal) is embedded in the via-hole VH1 and the first opening Z1 of the insulating layer 12, and the through-via (TSV) 17 of a BSV type is formed on the conductive layer 13 and the spacer layer 15. The through-via 17 comes into contact with the conductive layer 13.

For example, in a case where the through-via 17 has a stacked structure of a plurality of conductors (for example, a barrier metal layer and a metal layer), for example, a side wall metal layer (barrier metal) 179 of Ti and the like is formed on the conductive layer 13 and the spacer layer 15 by PVD (physical vapor deposition) to come into contact with the conductive layer 13. For example, the metal layer 170 of Ni (or Cu) is formed on the side wall metal layer 179 in accordance with a plating method. As described above, the via-hole VH1 is filled with the metal layers 170 and 179 in a stacked structure as the through-via 17.

For example, the width (dimension in a direction parallel with the principal surface of the semiconductor substrate) of the through-via 17 gradually decreases toward the front surface side from the back surface side of the semiconductor substrate 11 (refer to FIG. 2). Accordingly, the metal may be embedded with satisfactory coverage. As a result, in this embodiment, it is possible to improve reliability of the through-via 17.

After the through-via 17 is formed, the back surface bump is formed on the back surface of the semiconductor substrate 11, for example, in accordance with a plating method (refer to FIG. 4). Then, a reflow process is carried out with respect to the semiconductor substrate 11.

The semiconductor substrate (wafer), which includes the semiconductor device formed in accordance with the manufacturing method illustrated in FIGS. 5 to 11, is diced in a chip shape, and then, the support substrate 80 on a dicing sheet is removed from the semiconductor device 1. Thus, the semiconductor device (semiconductor chip) 1 that is made into a small piece illustrated in FIG. 2 is formed.

Through the above-described manufacturing processes, the semiconductor device (for example, a NAND type flash memory) according to this embodiment is formed.

For example, a plurality of the semiconductor devices 1 are stacked, and are packaged in a packaging material. Thus, the package device (memory package) 50 illustrated in FIG. 1 is formed. The package device 50 is mounted on the package substrate 500.

(c) Effect

In the method of manufacturing the semiconductor device according to this embodiment, after forming the via-hole, the surface state (the dangling bond of silicon) of the side wall of the semiconductor substrate 11, which is generated due to formation of the via-hole VH1, is coupled to hydrogen due to the annealing process in the hydrogen atmosphere similar to the process illustrated in FIG. 10A, and thus a surface layer of the side wall of the semiconductor substrate 11 is terminated with hydrogen. Thus, the processing surface (surface state) of the side wall of the semiconductor substrate 11 is inactivated.

As described above, in this embodiment, it is possible to reduce the dangling bonds of silicon at the interface between the semiconductor substrate 11 and the spacer layer 15 in the via-hole, and thus it is possible to suppress trapping (generation of a fixed charge) of holes or electrons by the dangling bond.

In addition, in the method of manufacturing the semiconductor device according to this embodiment, as is the case with the process illustrated in FIG. 11, moisture in the spacer layer 15 is removed through the annealing process with respect to the spacer layer 15 on the side wall of the semiconductor substrate 11.

Thus, in the semiconductor device according to this embodiment, an adverse effect on the capacitive component of the through-via 17, such as an increase in a dielectric constant of the spacer layer (insulating layer) 15, and a variation in the capacitive component of the through-via 17, which are caused by moisture in the spacer layer 15, is suppressed due to removal of moisture in the spacer layer 15.

In addition, the annealing process with respect to the spacer layer 15 is carried out in an hydrogen atmosphere, and thus in this embodiment, it is possible to reduce the dangling bonds of silicon included in the spacer layer (for example, a silicon oxide layer) 15. As a result, the semiconductor device according to this embodiment may reduce occurrence of a fixed charge that is caused by dangling bonds in the spacer layer 15.

Accordingly, in the semiconductor device and the method of manufacturing the same according to this embodiment, it is possible to suppress variations of the capacitance of the through-via 17 from a desired design value due to the fixed charge of the semiconductor substrate 11 and the spacer layer 15, and moisture in the spacer layer 15. In addition, in the semiconductor device according to this embodiment, it is possible to suppress a variation in the capacitive component of the through-via, which is caused by generation and disappearance of the fixed charge due to application of a potential with respect to the external connection terminal (through-via 17), during the operation of the semiconductor device.

According to this embodiment, with regard to a plurality of external connection terminals in the semiconductor device, it is possible to suppress occurrence of a deviation in the capacitive component of the external connection terminal between the plurality of external connection terminals, which is caused by the dangling bond (interface state) at the interface between the semiconductor substrate 11 and the spacer layer 15, and moisture in the spacer layer 15.

According to this embodiment, in a case where the semiconductor device (for example, a NAND type flash memory) transmits a signal (for example, data) at a high speed, it is possible to suppress a difference in the signal transmission speed between potentials (signal levels) different from each other due to a variation in the capacitive component of the external connection terminal.

Figure 12A:
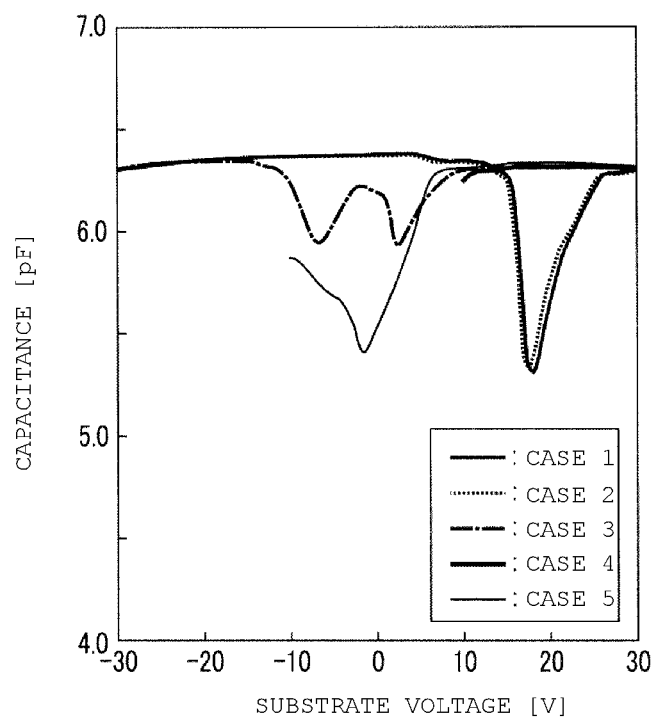
FIGS. 12A and 12B are views illustrating an effect of the method of manufacturing the semiconductor device according to the first embodiment.
Figure 12B:
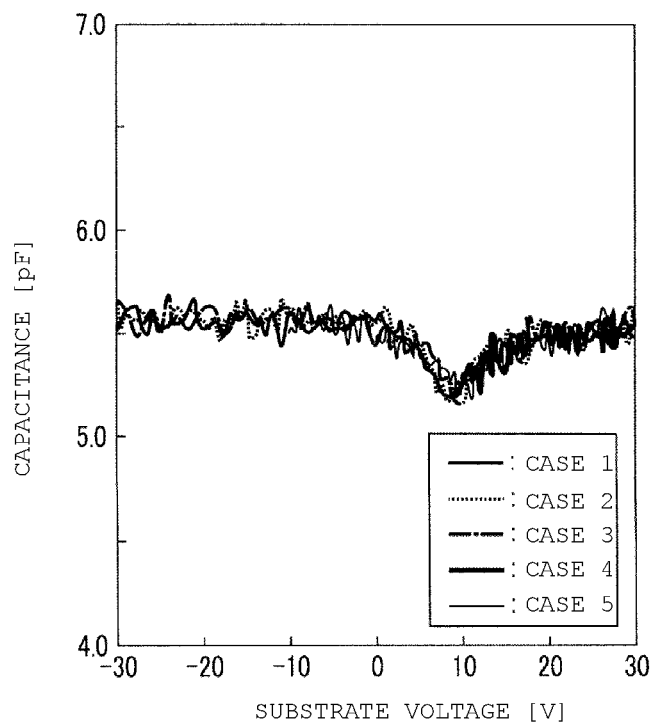

FIGS. 12A and 12B are views illustrating an effect of the method of manufacturing the semiconductor device according to this embodiment.

FIGS. 12A and 12B are graphs illustrating a relationship between a substrate voltage and capacitance of the through-via (TSV).

The graph in FIG. 12A illustrates a relationship between the substrate voltage and the capacitance of the through-via in a case where the annealing process in the hydrogen atmosphere with respect to the side wall of the semiconductor substrate is not carried out after formation of the via-hole as a reference example.

The graph in FIG. 12B illustrates a relationship between the substrate voltage and the capacitance of the through-via in a case where the annealing process in the hydrogen atmosphere with respect to the side wall of the semiconductor substrate is carried out similar to this embodiment. For the results shown in FIG. 12B, an annealing process temperature in the hydrogen atmosphere was 225° C.

In FIGS. 12A and 12B, the horizontal axis of the graphs corresponds to the substrate voltage (unit: V), and the vertical axis of the graphs corresponds to the capacitive component (unit: pF) of the through-via.

In addition, Case 1 to Case 5 in FIGS. 12A and 12B illustrate the capacitive component of the through-via in a case where a variation direction of the magnitude of the substrate voltage is different in each case, respectively.

Case 1 and Case 2 illustrate a relationship between the substrate voltage and the capacitive component of the through-via in a case where the substrate voltage varies from −30 V to +30 V.

Case 3 illustrates a relationship between the substrate voltage and the capacitive component of the through-via in a case where the substrate voltage varies from +30 V to −30 V.

Case 4 illustrates a relationship between the substrate voltage and the capacitive component of the through-via in a case where the substrate voltage varies from +30 V to +10 V.

Case 5 illustrates a relationship between the substrate voltage and the capacitive component of the through-via in a case where the substrate voltage varies from −10 V to +30 V.

Similar to the reference example illustrated in FIG. 12A, in a case where the annealing process in the hydrogen atmosphere is not carried out on the side wall of the semiconductor substrate in the via-hole, the variation of the capacitance of the through-via with respect to the substrate voltage is different in accordance with the effect of the fixed charge on the interface between the semiconductor substrate and the insulating layer (spacer layer) in each of Case 1 and Case 5 (substrate voltage application type).

As is the case with FIG. 12A, in a case where the annealing process in the hydrogen atmosphere is not carried out, the characteristics of the capacitive component of the through-via are unstable.

As illustrated in FIG. 12B, in a case where the annealing process in the hydrogen atmosphere is carried out with respect to the side wall of the semiconductor substrate in the via-hole similar to this embodiment, even when the substrate voltage is applied under conditions such as Case 1 to Case 5, the capacitive component of the through-via exhibits substantially the same characteristics (variation tendency).

As described above, in the method of manufacturing the semiconductor device according to this embodiment, it is possible to make the deviation in the capacitive characteristics of the through-via with respect to the voltage application state (voltage variation) small due to the annealing process in the hydrogen atmosphere after formation of the via-hole, and thus it is possible to stabilize the capacitive component of the through-via.

As described above, in the method of manufacturing the semiconductor device according to this embodiment, it is possible to form a semiconductor device that is stable in operation characteristics.

Accordingly, in the semiconductor device and the method of manufacturing the semiconductor device according to this embodiment, it is possible to provide a semiconductor device with high reliability.

(2) Second Embodiment

A method of manufacturing a semiconductor device according to a second embodiment will be described with reference to FIG. 13A.

The annealing process in the hydrogen atmosphere during the process of forming the through-via (TSV) may be carried out only after formation of the spacer layer (insulating layer) 15 without being carried out immediately after formation of the via-hole VH1 through RIE.

That is, in the method of manufacturing the semiconductor device according to the second embodiment, the annealing process in the hydrogen atmosphere with respect to the side wall of the semiconductor substrate 11 after formation of the via-hole VH1, and the annealing process in the hydrogen atmosphere with respect to the spacer layer 15 are done in common.

FIG. 13A is a cross-sectional process view illustrating a process of the method of manufacturing the semiconductor device according to the second embodiment.

As illustrated in FIG. 13A, the via-hole VH1 is formed in the semiconductor substrate 11 in the same process as in the method of manufacturing the semiconductor device according to the first embodiment.

In this embodiment, immediately after formation of the via-hole VH1, the annealing process in the hydrogen atmosphere is not carried out, and the spacer layer 15 is formed on the semiconductor substrate 11 in the via-hole VH1. For example, the spacer layer 15 may be formed by plasma CVD or a thermal oxidation process.

After formation of the spacer layer 15, an annealing process 402 at a temperature of 100° C. to 250° C. is carried out in the hydrogen atmosphere. In the annealing process 402, the dangling bond of silicon in the spacer layer 15 is coupled to hydrogen. In addition, moisture in the spacer layer 15 is removed by heat.

The film thickness of the spacer layer 15 is relatively small, and the atomic size of hydrogen is small. Thus, during the annealing process after formation of the spacer layer 15, hydrogen passes through the inside of the spacer layer 15 and reaches the surface layer (interface between the semiconductor substrate 11 and the insulating layer 15) of the side wall of the semiconductor substrate 11 in the via-hole VH1.

Thus, as shown in FIG. 13B, hydrogen is coupled to the dangling bond DB of silicon that exists on the side wall of the semiconductor substrate (silicon substrate) 11.

As described above, after formation of the spacer layer 15, the dangling bond of silicon on the interface of the semiconductor substrate 11 and the spacer layer 15 is reduced through the annealing process 402 in the hydrogen atmosphere which is common to the semiconductor substrate 11 and the spacer layer 15.

As a result, in the method of manufacturing the semiconductor device according to the second embodiment, it is possible to form a semiconductor device in which a variation in the capacitive component of the through-via (external connection terminal) is suppressed in substantially the same manner as the first embodiment.

Accordingly, in the method of manufacturing the semiconductor device according to the second embodiment, it is possible to provide a semiconductor device in which operation characteristics are stable and reliability is high.

In addition, in the method of manufacturing the semiconductor device according to the second embodiment, it is possible to reduce the number of times of the annealing process in the hydrogen gas atmosphere due to the commonization of the annealing process. As a result, in the method of manufacturing the semiconductor device according to the second embodiment, it is possible to reduce the manufacturing cost of the semiconductor device.

(3) Third Embodiment

A method of manufacturing a semiconductor device according to a third embodiment will be described with reference to FIG. 14A.

The annealing process with respect to the spacer layer (insulating layer) 15 may be carried out in a gas atmosphere that does not contain the hydrogen gas.

FIG. 14A is a cross-sectional process view illustrating a process of the method of manufacturing the semiconductor device according to the third embodiment.

As illustrated in FIG. 14A, an annealing process 403 is carried out, for example, in a temperature range from 100° C. to 250° C. by using a gas 490 that does not contain hydrogen. Thus, moisture in the spacer layer 15 is removed.

As shown in FIG. 14B, a main component of the spacer layer 15 is a silicon compound. Accordingly, the number of dangling bonds of silicon in the spacer layer 15 is less than the number of dangling bonds of silicon on the interface between the semiconductor substrate 11 and the spacer layer 15. Accordingly, even when the dangling bond of silicon in the spacer layer 15 remains, an effect of the fixed charge, which is caused by the dangling bond of silicon in the spacer layer 15, is small.

In addition, the majority of the variation in the capacitive component of the through-via 17 is caused by moisture that is contained in the spacer layer 15.

Accordingly, when the annealing process 403 is carried out with respect to the spacer layer 15 under conditions capable of removing moisture of the spacer layer 15, the variation in the capacitive component of the through-via 17, which is caused by the spacer layer 15, is improved.

As described above, even when the annealing process 403 with respect to the spacer layer 15 is carried out in a gas atmosphere that does not contain hydrogen, in the method of manufacturing the semiconductor device according to the third embodiment, it is possible to form a semiconductor device in which variations in the capacitive component of the external connection terminal is suppressed in substantially the same manner as the first embodiment.

As a result, in the method of manufacturing the semiconductor device according to the third embodiment, it is possible to provide a semiconductor device in which operation characteristics are stable and reliability is high.

In addition, in the method of manufacturing the semiconductor device according to the third embodiment, the hydrogen gas that is used in the annealing process is eliminated, and thus it is possible to reduce the manufacturing cost of the semiconductor device.

However, with regard to a modification example of the method of manufacturing the semiconductor device according to this embodiment, for example, the annealing process in the hydrogen atmosphere with respect to the side wall (processing surface) of the semiconductor substrate may not be carried out, and only the annealing process 403 using a gas that does not contain hydrogen may be carried out with respect to the spacer layer 15 in accordance with characteristics which are demanded for a semiconductor device that is formed.

(5) Others

In the semiconductor device and the method of manufacturing the semiconductor device according to the embodiments, the kind of semiconductor devices is not limited as long as the semiconductor devices are devices to which the through-electrode (TSV) through the BSV process is applied. For example, the semiconductor device according to this embodiment is selected from the group including a NAND type flash memory, a three-dimensional structure flash memory, an MRAM, an image sensor, an FPGA, and a logic circuit. As a method of manufacturing these semiconductor devices, any one of the methods of manufacturing the semiconductor device which are described in the first to third embodiments is applied.

Processes of forming an element on a front surface side of the semiconductor substrate is not limited as long as the processes are carried out in the order capable of securing matching properties of the processes used in forming the circuit area 900 and the external connection terminal area 909.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   forming a first insulating layer on a first surface of a semiconductor substrate comprising silicon;
   forming a conductive layer on the first insulating layer;
   forming a first opening that extends from a second surface of the semiconductor substrate opposite to the first surface toward the first surface, the first opening extending in the semiconductor substrate to the first insulating layer;
   performing a first annealing process in a first gas atmosphere that contains hydrogen after formation of the first opening;
   forming a second insulating layer on a side wall of the semiconductor substrate in the first opening;
   performing a second annealing process after formation of the second insulating layer;
   forming a second opening that extends in the first insulating layer to the conductive layer through the first opening; and
   forming a through-via in the first and second openings that is connected to the conductive layer.

2. The method according to claim 1,
   wherein the second annealing process is performed in a second gas atmosphere that contains hydrogen.

3. The method according to claim 2,
   wherein a first hydrogen region is formed in the semiconductor substrate by the first annealing process.

4. The method according to claim 2,
   wherein the first and second annealing processes are performed using a hydrogen radical or deuterium.

5. The method according to claim 4,
   wherein a first hydrogen region is formed in the semiconductor substrate by the first annealing process.

6. The method according to claim 1,
   wherein a first hydrogen region is formed in the semiconductor substrate by the first annealing process.

7. The method according to claim 1,
   wherein the through-via has a width dimension at the second surface that is equal to or greater than a width dimension of the second opening.

8. A method of manufacturing a semiconductor device, comprising:
   forming a first insulating layer on a first surface of a semiconductor substrate comprising silicon;
   forming a conductive layer on the first insulating layer;
   forming a first opening in the semiconductor substrate, the first opening extending from a second surface of the semiconductor substrate that is opposite the first surface, toward the first surface to reach the first insulating layer;

forming a second insulating layer on a side wall of the first opening in the semiconductor substrate;
performing an annealing process after formation of the second insulating layer;
forming a second opening, which extends to the conductive layer, in the first insulating layer through the first opening; and
forming a through-via in the first and second openings which is connected to the conductive layer.

9. The method according to claim 8, further comprising:
performing an annealing process in an atmosphere that contains hydrogen after formation of the first opening.

10. The method according to claim 8,
wherein the annealing process is performed using a hydrogen radical or deuterium.

11. The method according to claim 8,
wherein a first hydrogen region is formed in the side wall of the first opening in semiconductor substrate by the first annealing process.

12. The method according to claim 8,
wherein the through-via has a width dimension at the second surface which is equal to or greater than a width dimension at the first opening.

* * * * *